(12) United States Patent
Hu et al.

(10) Patent No.: US 10,510,385 B2
(45) Date of Patent: Dec. 17, 2019

(54) WRITE SCHEME FOR A STATIC RANDOM ACCESS MEMORY (SRAM)

(71) Applicant: GLOBALFOUNDRIES INC., Grand Cayman (KY)

(72) Inventors: Xiaoli Hu, Shanghai (CN); Wei Zhao, Shanghai (CN); Hao Pu, Shanghai (CN)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 15/903,826

(22) Filed: Feb. 23, 2018

(65) Prior Publication Data
US 2019/0267052 A1   Aug. 29, 2019

(51) Int. Cl.
*G11C 7/12* (2006.01)
*G11C 11/419* (2006.01)

(52) U.S. Cl.
CPC ............. *G11C 7/12* (2013.01); *G11C 11/419* (2013.01)

(58) Field of Classification Search
CPC ................................. G11C 7/12; G11C 11/419
See application file for complete search history.

(56) References Cited

U.S. PATENT DOCUMENTS

| | | | |
|---|---|---|---|
| 3,699,539 A | 10/1972 | Spence | |
| 5,233,560 A | 8/1993 | Foss et al. | |
| 5,828,612 A | 10/1998 | Yu et al. | |
| 5,850,367 A * | 12/1998 | Wada | G11C 11/419 365/230.03 |
| 7,586,806 B2 * | 9/2009 | Wong | G11C 5/147 365/189.16 |
| 7,626,878 B1 | 12/2009 | Lin et al. | |
| 7,679,948 B2 | 3/2010 | Kim et al. | |
| 7,839,713 B1 | 11/2010 | Yu et al. | |
| 7,936,624 B2 | 5/2011 | Clinton | |
| 8,325,512 B2 | 12/2012 | Chuang et al. | |
| 8,363,453 B2 | 1/2013 | Arsovski et al. | |
| 8,648,654 B1 * | 2/2014 | Myers | H03K 19/0016 327/565 |
| 8,953,401 B2 | 2/2015 | Chen | |
| 9,570,155 B2 | 2/2017 | Braceras et al. | |
| 9,824,749 B1 * | 11/2017 | Nautiyal | G11C 11/419 |

(Continued)

FOREIGN PATENT DOCUMENTS

TW   201301293   1/2013

OTHER PUBLICATIONS

Taiwanese Office Action dated Oct. 2, 2018 in related TW Application No. 107107003, 11 pages.

(Continued)

*Primary Examiner* — Jerome Leboeuf
(74) *Attorney, Agent, or Firm* — Michael Le Strange; Andrew M. Calderon; Roberts Mlotkowski Safran Cole & Calderon, P.C.

(57) ABSTRACT

A structure includes a write driver circuit configured to drive both a true bitline side and a complement bitline side up to a power supply and down to ground such that one of the true bitline side and the complement bitline side is driven to ground and another of the true bitline side and the complement bitline side is driven to a high level at a same time and before a precharge below a level of the power supply of the one of the true bitline side and the complement bitline side.

20 Claims, 4 Drawing Sheets

(56) References Cited

U.S. PATENT DOCUMENTS

| | | |
|---|---|---|
| 2005/0063238 A1 | 3/2005 | Nambu et al. |
| 2005/0078508 A1 | 4/2005 | Chan et al. |
| 2005/0152199 A1 | 7/2005 | Park et al. |
| 2007/0058421 A1 | 3/2007 | Chan et al. |
| 2011/0149662 A1* | 6/2011 | Batra ........................ G11C 7/12 365/189.16 |
| 2015/0131368 A1* | 5/2015 | Adams .................. G11C 11/419 365/156 |
| 2016/0365139 A1* | 12/2016 | Braceras ............... G11C 11/419 |

OTHER PUBLICATIONS

Taiwanese Notice of Allowance dated Jan. 28, 2019 in related TW Application No. 107107003, 4 pages.
Office Action dated Apr. 4, 2019 in related U.S. Appl. No. 15/814,969, 8 pages.
Notice of Allowance dated Aug. 22, 2019 in related U.S. Appl. No. 15/814,969, 16 pages.

* cited by examiner

|  | unit: ps |  | unit: GHz |  |
| --- | --- | --- | --- | --- |
|  | cyc | acc | Fcyc | Facc |
| NM | 680 | 301 | 1.19 | 1.91 |
| NM_new | 484 |  | 1.64 |  |
| WM | 791 | 322 | 1.03 | 1.82 |
| WM_new | 528 |  | 1.51 |  |

FIG. 4

WRITE SCHEME FOR A STATIC RANDOM ACCESS MEMORY (SRAM)

FIELD OF THE INVENTION

The present disclosure relates to a write scheme, and more particularly, to a circuit and a method for a write scheme for a static random access memory (SRAM) and related functionality.

BACKGROUND

Memory devices are employed as internal storage areas in a computer or other electronic equipment. One specific type of memory used to store data in a computer is random access memory (RAM). RAM is typically used as a main memory in a computer environment, and is generally volatile in that once power is turned off all data stored in the RAM is lost.

A static random access memory (SRAM) is one example of a RAM. An SRAM has the advantage of holding data without a need for refreshing. A typical SRAM device includes an array of individual SRAM cells. Each SRAM cell is capable of storing a binary voltage value that represents a logical data bit (e.g., "0" or "1"). One existing configuration for a SRAM cell includes a pair of cross-coupled devices such as inverters. The inverters act as a latch that stores the data bit herein, so long as power is supplied to the memory array.

In a case of long bit lines, a write operation usually limits the SRAM frequency. Further, in a six-transistor (6T) SRAM cell, precharging the bitlines to full rail is necessary to avoid a potential read failure. Precharging the bitlines in a precharge phase usually requires approximately ⅓ of the total cycle time. In other SRAM cell configurations (i.e., an eight-transistor (8T) SRAM cell with dedicated write bit lines), there is no need to fully precharge the bitlines to full rail.

SUMMARY

In an aspect of the disclosure, a structure includes a write driver circuit configured to drive both a true bitline side and a complement bitline side up to a power supply and down to ground such that one of the true bitline side and the complement bitline side is driven to ground and another of the true bitline side and the complement bitline side is driven to a high level at a same time and before a precharge below a level of the power supply of the one of the true bitline side and the complement bitline side.

In another aspect of the disclosure, a method includes driving one of a true bitline and a complement bitline to ground in a write driver circuit and driving another of the true bitline and the complement bitline to a high level in the write driver circuit at a same time as the driving one of the true bitline and the complement bitline to ground and before a precharge below a level of a power supply of the one of the true bitline and the complement bitline.

In another aspect of the disclosure, a method includes driving one of a true bitline and a complement bitline to ground in a write driver circuit, driving another of the true bitline and the complement bitline to a high level in the write driver circuit, precharging below a level of a power supply of the one of the true bitline and the complement bitline before a wordline has a high value in the write driver circuit, and preventing precharging the another of the true bitline and the complement bitline after the wordline has a low value in the write driver circuit.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a write scheme, and more particularly, to a circuit and a method for a write scheme for a static random access memory (SRAM) and related functionality. More particularly, the present disclosure relates to a static random access memory (SRAM) which includes a write scheme and related functionality. Advantageously, the present disclosure provides an improved write scheme which increases memory performance by saving cycle time for a precharge phase. For example, the write scheme of the present disclosure can save cycle time by preventing bitlines from being fully precharged.

In an eight-transistor (8T) cell with dedicated bitlines or other memory applications, it is not necessary to fully precharge before the next write operation occurs. Therefore, the present disclosure can save ⅓ of the cycle time by preventing the bitlines from being fully precharged in a precharge phase. Also, advantageously, a pull down bitline slewrate is improved by removing a bitswitch passgate (compared to conventional circuits which include such passgate).

In the present disclosure, complementary bitlines are pulled up and pulled down before a wordline opens. When the wordline arrives, the pulled up bitlines will float to avoid flooding half-selected bitlines. In the present disclosure, the bitlines are precharged when the write is completed. Further, the bitlines will not be fully precharged (i.e., not at full rail) before the next write operation occurs, saving ⅓ of the total cycle time for column muxing SRAM.

Further, in implementing the circuit described herein, a two stack pull down improves bitline discharge speed in comparison to a conventional circuit which requires a three stack pull down. Moreover, the last ⅓ of the total cycle time is saved and the circuit complexity is reduced in comparison to a conventional circuit which requires a bitswitch passgate circuit (i.e., the third stack pull down). In addition, the write scheme disclosed herein has a smaller circuit overhead when used with a single multiplexor in comparison to conventional circuits.

Figure 1:
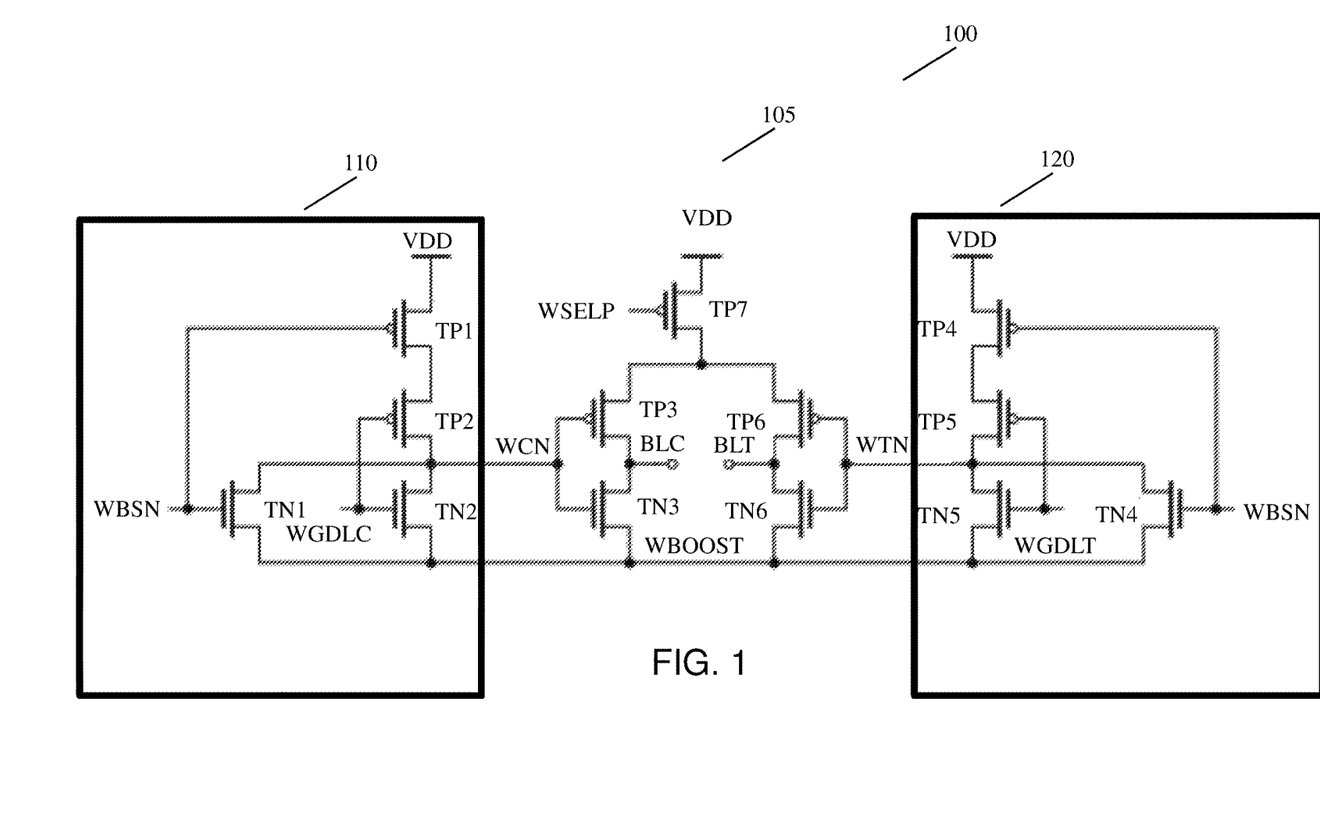
FIG. 1 shows a write scheme structure of an SRAM in accordance with aspects of the present disclosure.

FIG. 1 shows a write scheme structure of a SRAM in accordance with aspects of the present disclosure. In FIG. 1, the write scheme structure 100 (i.e., which includes a write driver circuit 105) includes a true bitline (BLT) and a complement bitline (BLC) which connect to an array. Further, the write scheme structure 100 includes a first NOR gate 110 and a second NOR gate 120.

Still referring to FIG. 1, the first NOR gate 110 includes a NMOS transistor TN1 which is gated with a global mux signal WBSN, a drain connected to a write complement signal WCN, and a source connected to a boost signal WBOOST. Further, the first NOR gate 110 includes a NMOS transistor TN2 which is gated with a complement data line WGDLC, a drain connected to the write complement signal WCN, and a source connected to the boost signal WBOOST. The first NOR gate 110 also includes a PMOS transistor TP1 which is gated with the global mux signal WBSN, a source connected to a power supply VDD, and a drain connected to a source of a PMOS transistor TP2. Further, the first NOR gate 110 includes the PMOS transistor TP2 which is gated with the complement data line WGDLC and a drain connected to the write complement signal WCN.

In FIG. 1, the second NOR gate 120 includes a NMOS transistor TN4 which is gated with the global mux signal WBSN, a drain connected to a write true signal WTN, and a source connected to the boost signal WBOOST. The second NOR gate 120 also includes a NMOS transistor TN5 which is gated with a true data line WGDLT, a drain connected to the write true signal WTN, and a source connected to the boost signal WBOOST. The second NOR gate 120 also includes a PMOS transistor TP5 which is gated with the true data line WGDLT, a drain connected to the write true signal WTN, and a source connected to a drain of a PMOS transistor TP4. Further, the second NOR gate 120 includes the PMOS transistor TP4 which is gated with the global mux signal WBSN and has a source connected to the power supply VDD.

Still referring to FIG. 1, the write scheme structure 100 includes a NMOS transistor TN3 which is gated with a write complement signal WCN, a drain connected to the BLC, and a source connected to the boost signal WBOOST. The write scheme structure 100 also includes a NMOS transistor TN6 which is gated with a write true signal WTN, a drain connected to the BLT, and a source connected to the boost signal WBOOST. Further, the write scheme structure 100 includes a PMOS transistor TP3 which is gated with the write complement signal WCN, a drain connected to the BLC, and a source connected to a drain of PMOS transistor TP7. The write scheme structure 100 also includes a PMOS transistor TP6 which is gated with the write true signal WTN, a drain connected to the BLT, and a source connected to the drain of PMOS transistor TP7. The PMOS transistor TP7 (i.e., a header device) is also gated with a global signal WSELP and a source connected to the power supply VDD.

In FIG. 1, the write scheme structure 100 can include a write driver circuit 105 which is configured to drive both a true bitline side and a complement bitline side up to a power supply and down to ground such that the true bitline side or the complement bitline side is driven to ground and the other true bitline side or the complement bitline side, respectively, is driven to a high level at a same time and before a particular precharge of the one of the true bitline and the complement bitline.

The write driver circuit 105 can include a first NOR gate 110, a second NOR gate 120, and a header device (e.g., a PMOS transistor TP7). The header device includes the PMOS transistor TP7 which is configured to turn off precharging the another of the true bitline side and the complement bitline side to avoid flooding half selected bitcells. The PMOS transistor TP7 is configured to turn off precharging the other true bitline side or the complement bitline side, respectively, in response to a gate of the PMOS transistor TP7 receiving a high value from a global signal WSELP. The global signal WSELP has the high value in response to a wordline WL being a high value. The global signal WSELP also cuts off precharging for both selected and half selected columns in response to a wordline WL being a high value.

The first NOR gate 110 and the second NOR gate 120 are configured to enable discharge of the one of the true bitline side and the complement bitline side to ground and a precharge below full rail (i.e., below a value of the power supply VDD) of the true bitline side and the complement bitline side before a wordline WL has a high value in response to a global mux signal WBSN having a high value. In other words, the precharge below full rail is in response to the WBSN having a high value (i.e., rising edge) which restores both the BLT and the BLC while it stops precharging and starts to pull the bitline up or down depending on data being written in a following cycle. Further, the write driver circuit 105 is part of a static random access memory (SRAM).

In operation, the BLC is driven by PMOS transistors TP3, TP7 (i.e., pull up devices) and NMOS transistor TN3 (i.e., pull down device). Therefore, in FIG. 1, the first ⅓ of the total cycle is used to pull down and pull up. Further, the gate of PMOS transistors TP3, TP7 are coupled together and controlled by the write complement signal WCN. PMOS transistor TP3 is stacked with the PMOS transistor TP7 and the gate of the PMOS transistor TP7 is controlled by the global signal WSELP. The global signal WSELP is used to keep the BLT and BLC floating during the write operation to avoid flooding half-selected bitlines. The source of NMOS TN3 is coupled to the boost signal WBOOST, with the boost signal WBOOST being a ground signal or a signal at a negative voltage.

Further, the first NOR gate 110 has inputs which include the global mux signal WBSN and the complement data line WGDLC and an output which includes the write complement signal WCN. The source of NMOS transistors TN1, TN2 are coupled to the boost signal WBOOST. The second NOR gate 120 has a similar structure as the first NOR gate 110.

Figure 2:
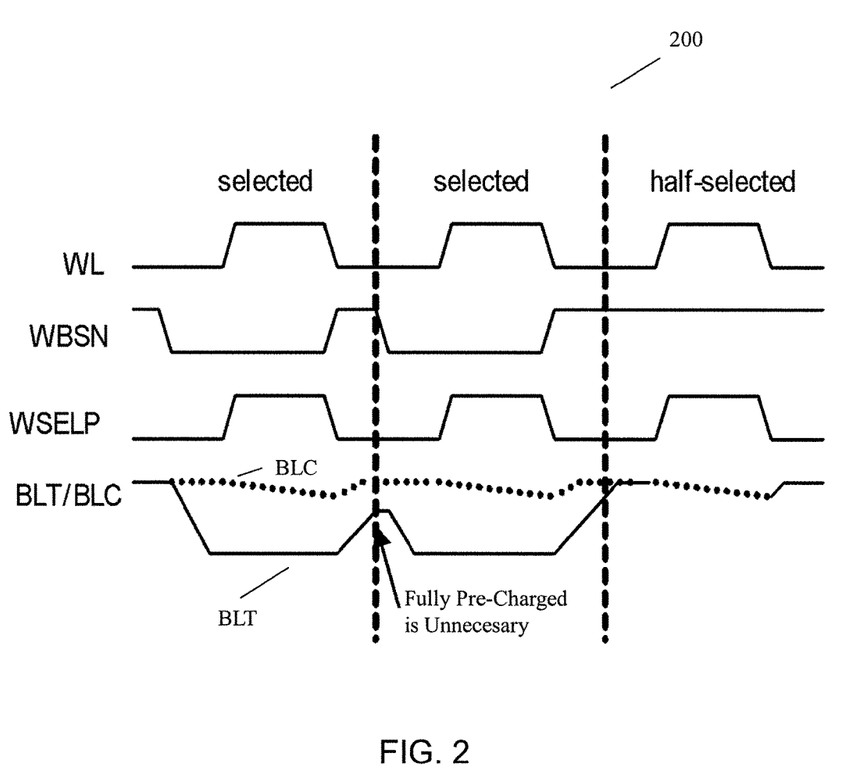
FIG. 2 shows a graph of the write scheme structure of the SRAM in accordance with aspects of the present disclosure

FIG. 2 shows a graph of the write scheme structure of the SRAM in accordance with aspects of the present disclosure. In FIG. 2, the graph 200 has a pre-charge phase in which the global signal WSELP is kept low and the bitlines BLT/BLC are pre-charged to high. When a bitcell is selected, the global mux signal WBSN goes low and the bitlines BLT/BLC correspond to the write data.

For example, as shown in the graph 200, if the true side is being written, BLT goes low and BLC goes high. When a wordline WL opens, the global signal WSELP will also go high which causes the PMOS transistor TP7 to turn off. In this situation, BLC will be floating.

When the wordline WL shuts off, the global signal WSELP will also go low and the global mux signal WBSN will go high, and the bitlines BLT/BLC will again be pre-charged. For the half-selected (HS) bitcells, since the global signal WSELP turns high when the wordline WL opens, the bitlines will both be floating. This prevents flooding off the HS bitcells. Further, when performing a consecutive write, a bitline (e.g., BLT in FIG. 2) is not fully pre-charged to full rail/power supply signal, which improves write performance. As previously noted, the precharge below full rail is in response to the WBSN having a high value (i.e., rising edge) which restores both the BLT and the BLC while it stops precharging and starts to pull the bitline up or down depending on data being written in a following cycle.

Figure 3:
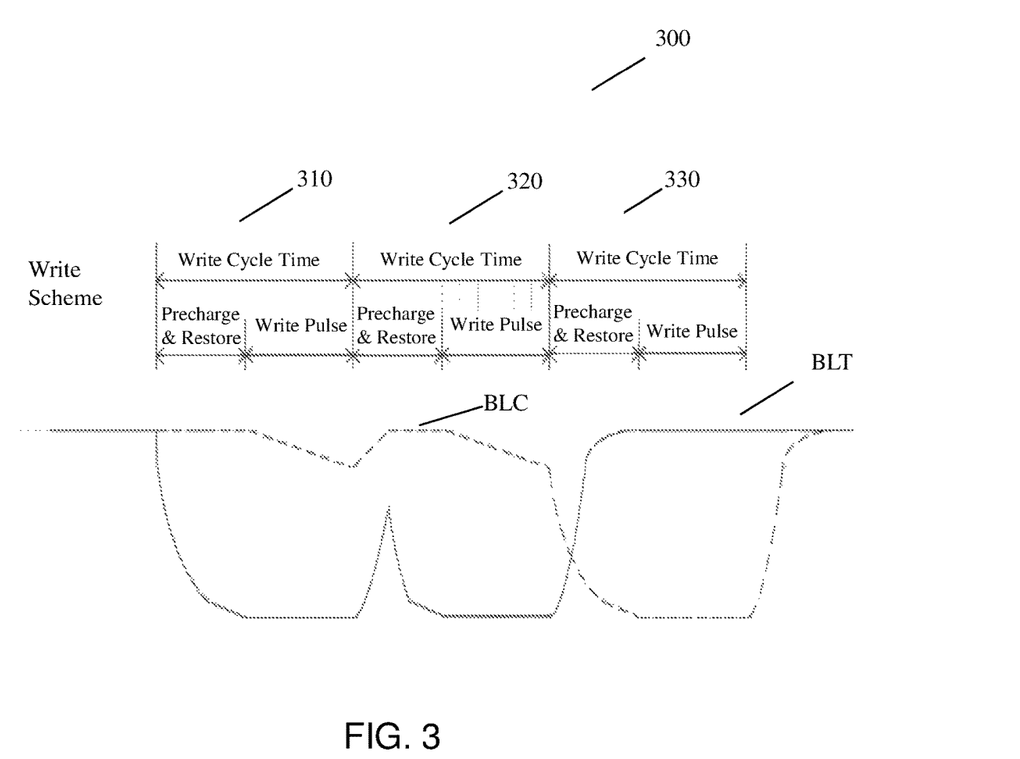
FIG. 3 shows another graph of the write scheme structure of the SRAM in accordance with aspects of the present disclosure.

FIG. 3 shows another graph of the write scheme structure of the SRAM in accordance with aspects of the present disclosure. In FIG. 3, the graph 300 includes three write cycles 310, 320, and 330. Each of the write cycles 310, 320, and 330 include a precharge and restore phase and a write pulse phase. In an example shown in the write cycle 310, the true side is being written. Therefore, in the write cycle 310, the BLT goes to a low level and BLC is at a high level during the precharge and restore phase. During the write pulse phase of the write cycle 310, the BLT stays at a low level and the BLC stays at a high level with a slight dip.

In the write cycle 320, during the precharge and restore phase, the BLC stays high and the BLT gets precharged to a level which is not fully pre-charged/full rail. Therefore, the BLT gets precharged to a level below full pre-charge/full rail, which improves the write performance. During the write pulse of the write cycle 320, the BLC stays at a high level with a slight dip and the BLT goes to a low level.

In an example shown in the write cycle 330, the complement side is being written. Therefore, in the write cycle 330, during the precharge and restore phase, the BLC goes to a low level and the BLT goes to a high level. At the write pulse of the write cycle 330, the BLT stays at a high level and the BLC stays at a low level.

Figure 4:
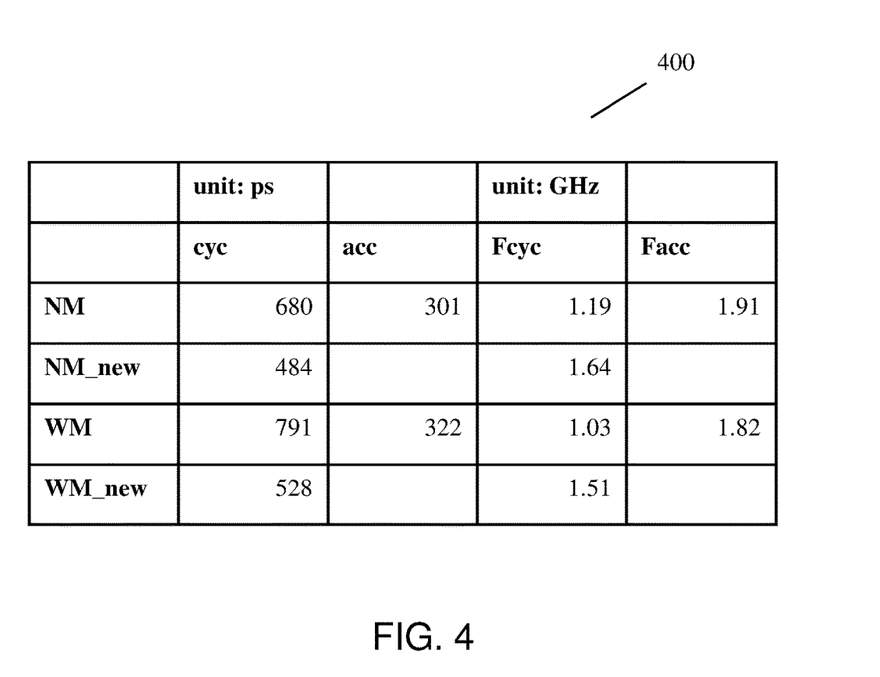
FIG. 4 shows the performance of the write scheme structure of the SRAM in accordance with aspects of the present disclosure.

FIG. 4 shows the performance of the write scheme structure of the SRAM in accordance with aspects of the present disclosure. In FIG. 4, the table 400 shows the performance of the circuit disclosed herein in a nominal metal NM (i.e., metal capacitance) and a worst metal WM (i.e., metal with a maximum capacitance). In the table 400, the nominal metal NM for a conventional circuit has a performance cycle frequency of 1.19 GHz. In contrast, in the present disclosure, the nominal metal NM has a performance cycle frequency of 1.64 GHz. Thus, the write scheme disclosed herein of the present disclosure has approximately a 38% performance increase in the nominal metal NM situation.

Still referring to FIG. 4, the table 400 also shows that the worst metal WM for a conventional circuit has a performance cycle frequency of 1.03 GHz. In contrast, in the presently disclosed circuit, the worst metal WM has a performance frequency cycle frequency of 1.51 GHz. Thus, the write scheme structure of the present disclosure has approximately a 47% performance increase in the worst metal WM situation.

In summary with respect to FIGS. 1-4, the BLC is driven by PMOS transistors TP3, TP7 (i.e., pull up devices) and NMOS transistor TN3 (i.e., pull down device). Therefore, in FIG. 1, the first ⅓ of the total cycle is used to pull down and pull up. Further, the gate of PMOS transistors TP3, TP7 are coupled together and controlled by the write complement signal WCN. PMOS transistor TP3 is stacked with the PMOS transistor TP7 and the gate of the PMOS transistor TP7 is controlled by the global signal WSELP. The global signal WSELP is used to keep the BLT and BLC floating during the write operation to avoid flooding half-selected bitlines. The source of NMOS TN3 is coupled to the boost signal WBOOST, with the boost signal WBOOST being a ground signal or a signal at a negative voltage.

Further, with respect to FIGS. 1-4, the first NOR gate 110 has inputs which include the global mux signal WBSN and the complement data line WGDLC and an output which includes the write complement signal WCN. The source of NMOS transistors TN1, TN2 are coupled to the boost signal WBOOST. The second NOR gate 120 has a similar structure as the first NOR gate 110.

In FIGS. 1-4, a pre-charge phase is a phase in which the global signal WSELP is kept low and the bitlines BLT/BLC are pre-charged to high. When a bitcell is selected, the global mux signal WBSN goes low and the bitlines BLT/BLC correspond to the write data. If the true side is being written, BLT goes low and BLC goes high. When a wordline WL opens, the global signal WSELP will also go high which causes the PMOS transistor TP7 to turn off. In this situation, BLC will be floating.

When the wordline WL shuts off, the global signal WSELP will also go low and the global mux signal WBSN will go high, and the bitlines BLT/BLC will again be pre-charged. For the half-selected (HS) bitcells, since the global signal WSELP turns high when the wordline WL opens, the bitlines will both be floating. This prevents flooding off the HS bitcells. Further, when performing a consecutive write, a bitline (e.g., BLT in FIG. 2) is not fully pre-charged to full rail/power supply signal, which improves write performance. Again, the precharge below full rail is in response to the WBSN having a high value (i.e., rising edge) which restores both the BLT and the BLC while it stops precharging and starts to pull the bitline up or down depending on data being written in a following cycle.

The circuit and the method for a write scheme for a static random access memory (SRAM) of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for a write scheme for a static random access memory (SRAM) of the present disclosure has been adopted from integrated circuit (IC) technology. For example, the structures are built on wafers and are realized in films of material patterned by photolithographic processes on the top of a wafer. In particular, the fabrication of the circuit and the method for a write scheme for a static random access memory (SRAM) uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a write driver circuit which is configured to drive both a true bitline side and a complement bitline side up to a power supply and down to ground such that one of the true bitline side and the complement bitline side is driven to ground and another of the true bitline side and the complement bitline side is driven to a high level at a same time in a first write cycle and before a precharge phase of a second write cycle, after the first write cycle, in which the one of the true bitline side and the complement bitline side is precharged to a precharge level below the high level and the another of the true bitline side and the complement bitline side is kept at the high level in the second write cycle,
wherein the write driver circuit comprises a first transistor with a source connected to the power supply, a gate directly connected to a global signal, and a drain connected to a source of a second transistor with a gate directly connected to a write complement signal and a drain connected to a drain of a third transistor with a gate directly connected to the write complement signal and a source connected to a source of a fourth transistor with a gate directly connected to a write true signal and a drain connected to a drain of a fifth transistor with a gate directly connected to the write true signal and a source connected to the drain of the first transistor.

2. The structure of claim 1, wherein the write driver circuit comprises a first NOR gate, a second NOR gate, and the first transistor.

3. The structure of claim 2, wherein the first transistor comprises a PMOS transistor which is configured to turn off precharging the another of the true bitline side and the complement bitline side to avoid flooding half selected bitcells.

4. The structure of claim 3, wherein the PMOS transistor is configured to turn off precharging the another of the true bitline side and the complement bitline side in response to the gate of the PMOS transistor receiving a high value from a global signal.

5. The structure of claim 4, wherein the global signal has the high value in response to a wordline being the high value.

6. The structure of claim 4, wherein the global signal cuts off precharging for both selected and half selected columns in response to a wordline being the high value.

7. The structure of claim 2, wherein the first NOR gate and the second NOR gate are configured to enable discharge of the one of the true bitline side and the complement bitline side to ground and the one of the true bitline side and the complement bitline side being precharged to the precharge level below the high level, before a wordline has a high value in response to a global mux signal having a low value.

8. The structure of claim 2, wherein the first NOR gate and the second NOR gate are configured to restore both the true bitline side and the complement bitline side after a wordline goes to a low value in response to a global mux signal having a high value.

9. The structure of claim 2, wherein the first NOR gate comprises two PMOS transistors and one NMOS transistor in series between a power supply and a boost signal.

10. The structure of claim 9, wherein the first NOR gate comprises another NMOS transistor which is gated with a global mux signal.

11. The structure of claim 2, wherein the second NOR gate comprises two PMOS transistors and one NMOS transistor in series between a power supply and a boost signal.

12. The structure of claim 11, wherein the second NOR gate comprises another NMOS transistor which is gated with a global mux signal.

13. The structure of claim 1, wherein the write driver circuit is part of a static random access memory (SRAM).

14. A method, comprising:
driving one of a true bitline and a complement bitline to ground during a first write cycle in a write driver circuit;
driving another of the true bitline and the complement bitline to a high level during the first write cycle in the write driver circuit at a same time as the driving one of the true bitline and the complement bitline to ground and before a precharge phase of a second write cycle, after the first write cycle; and
precharging the one of the true bitline and the complement bitline to a precharge level below the high level and keeping the another of the true bitline side and the complement bitline side at the high level during the precharge phase of the second write cycle,
wherein the write driver circuit comprises a first PMOS transistor with a source connected to a power supply, a gate directly connected to a global signal, and a drain connected to a source of a second PMOS transistor with a gate directly connected to a write complement signal and a drain connected to a drain of a third NMOS transistor with a gate directly connected to the write complement signal and a source connected to a source of a fourth NMOS transistor with a gate directly connected to a write true signal and a drain connected to a drain of a fifth PMOS transistor with a gate directly connected to the write true signal and a source connected to the drain of the first PMOS transistor.

15. The method of claim 14, further comprising precharging the one of the true bitline and the complement bitline below the high level, before a wordline has a high value in response to a global mux signal having a low value.

16. The method of claim 14, wherein the driving one of the true bitline and the complement bitline to ground occurs before a wordline has a high value in response to a global mux signal having a low value.

17. The method of claim 14, further comprising restoring both the true bitline and the complement bitline after a wordline goes to a low value in response to a global mux signal having a high value.

18. The method of claim 14, wherein the writer driver circuit comprises a first NOR gate, a second NOR gate, and the first PMOS transistor.

19. The method of claim 14, wherein the write driver circuit is part of a static random access memory (SRAM).

20. A method, comprising:
driving one of a true bitline and a complement bitline to ground during a first write cycle in a write driver circuit;
driving another of the true bitline and the complement bitline to a high level during the first write cycle in the write driver circuit;
precharging the one of the true bitline and the complement bitline to a precharge level below the high level and keeping the another of the true bitline side and the complement bitline side at the high level during a second write cycle, after the first write cycle and before a wordline has a high value in the write driver circuit; and preventing precharging the another of the true bitline and the complement bitline after the wordline has a low value in the write driver circuit, wherein the write driver circuit comprises a first PMOS transistor with a source connected to a power supply, a gate directly connected to a global signal, and a drain connected to a source of a second PMOS transistor with a gate directly connected to a write complement signal and a drain connected to a drain of a third NMOS transistor with a gate directly connected to the write complement signal and a source connected to a source of a fourth NMOS transistor with a gate directly connected to a write true signal and a drain connected to a drain of a fifth PMOS transistor with a gate directly connected to the write true signal and a source connected to the drain of the first PMOS transistor.

* * * * *